US010651596B1

(12) United States Patent
Liu et al.

(10) Patent No.: US 10,651,596 B1
(45) Date of Patent: May 12, 2020

(54) ROLLER MECHANISM FOR BURN-IN SOCKET

(71) Applicant: Foxconn Interconnect Technology Limited, San Jose, CA (US)

(72) Inventors: Xiao-Tong Liu, Kunshan (CN); Ming-Yue Chen, New Taipei (TW); Andrew David Gattuso, Phoenix, AZ (US); Pradeep Kodali, Phoenix, AZ (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/141,964

(22) Filed: Sep. 25, 2018

(30) Foreign Application Priority Data

Sep. 25, 2017 (CN) .......................... 2017 1 0874218
Feb. 7, 2018 (CN) ..................... 2018 2 0218842 U

(51) Int. Cl.
*H01R 13/629* (2006.01)
*H01R 13/52* (2006.01)

(52) U.S. Cl.
CPC ... *H01R 13/62955* (2013.01); *H01R 13/5213* (2013.01)

(58) Field of Classification Search
CPC ..................... H01R 13/62955; H01R 13/5213
USPC ... 439/136, 71, 73, 330, 331, 348, 525, 526, 439/70
See application file for complete search history.

(56) References Cited

U.S. PATENT DOCUMENTS

| 5,984,709 | A | 11/1999 | Zink et al. | |
|---|---|---|---|---|
| 7,287,997 | B2 * | 10/2007 | Matsuo | G01R 1/0466 |
| | | | | 439/266 |
| 8,021,177 | B2 * | 9/2011 | Chen | G01R 1/0466 |
| | | | | 439/264 |
| 8,926,353 | B2 * | 1/2015 | Chen | G01R 1/0466 |
| | | | | 439/268 |
| 8,961,212 | B2 * | 2/2015 | Lin | G01R 1/0466 |
| | | | | 439/330 |
| 2010/0003838 | A1 * | 1/2010 | Cai | G01R 1/0466 |
| | | | | 439/73 |

FOREIGN PATENT DOCUMENTS

| CN | 201230108 Y | 4/2009 |
|---|---|---|
| CN | 101662117 A | 3/2010 |
| CN | 101990503 A | 3/2011 |
| CN | 202693620 U | 1/2013 |
| CN | 203193001 U | 9/2013 |

* cited by examiner

*Primary Examiner* — Travis S Chambers
(74) *Attorney, Agent, or Firm* — We Te Chung; Ming Chieh Chang

(57) ABSTRACT

An electrical connector for testing an electronic package, includes an insulative housing, an insulative sliding plate mounted upon the housing and moveable horizontally along a transverse direction, and a cover up-and-down movable relative to the housing in a vertical direction. The cover forms the actuating parts to contact the rollers of the sliding plate when the cover is downwardly pressed so as to not only urge the sliding plate to move horizontally in the transverse direction but also smoothly move downwardly to a lower position where the electronic package may be loaded upon the sliding plate in a zero insertion force condition with regard to the contacts.

20 Claims, 18 Drawing Sheets

ROLLER MECHANISM FOR BURN-IN SOCKET

BACKGROUND OF THE DISCLOSURE

1. Field of the Disclosure

The present disclosure relates to an electrical connector, and more particularly to an electrical connector with the roller mechanism actuating the sliding plate.

2. Description of Related Arts

U.S. Pat. Nos. 8,926,353 and 8,961,212 discloses an electrical connector with a sliding plate which is actuated by an up-and-down cover to move horizontally so as to have the electronic package, e.g., the CPU (Central Processing Unit), which is seated upon the sliding plate, engaged with the contact in the connector. Because the actuation between the cover and the sliding plate is essentially frictional via corresponding wedged structures, relatively large actuation force and wearing occur inevitably. In addition, the more the amount of the contacts is, the larger the corresponding reaction force is during sliding movement of the sliding plate inevitably, too.

An improved electrical connector which can be operated in a force-saving manner is desired.

SUMMARY OF THE DISCLOSURE

Accordingly, an object of the present disclosure is to provide an electrical connector with grounding mechanism for enhancing high frequency performance.

To achieve the above object, an electrical connector for testing an electronic package, includes an insulative housing, an insulative sliding plate mounted upon the housing and moveable horizontally along a transverse direction, and a cover up-and-down movable relative to the housing in a vertical direction. The cover forms the actuating parts to contact the rollers of the sliding plate when the cover is downwardly pressed so as to not only urge the sliding plate to move horizontally in the transverse direction but also smoothly move downwardly to a lower position where the electronic package may be loaded upon the sliding plate in a zero insertion force condition with regard to the contacts. The cover is upwardly moved by one set of springs when the downward pressing force is remove therefrom to release the corresponding sliding plate so that the sliding plate is horizontally moved back in an opposite transverse direction to the original position, by another set of springs, where the electronic package is mechanically and electrically connected to the contacts.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
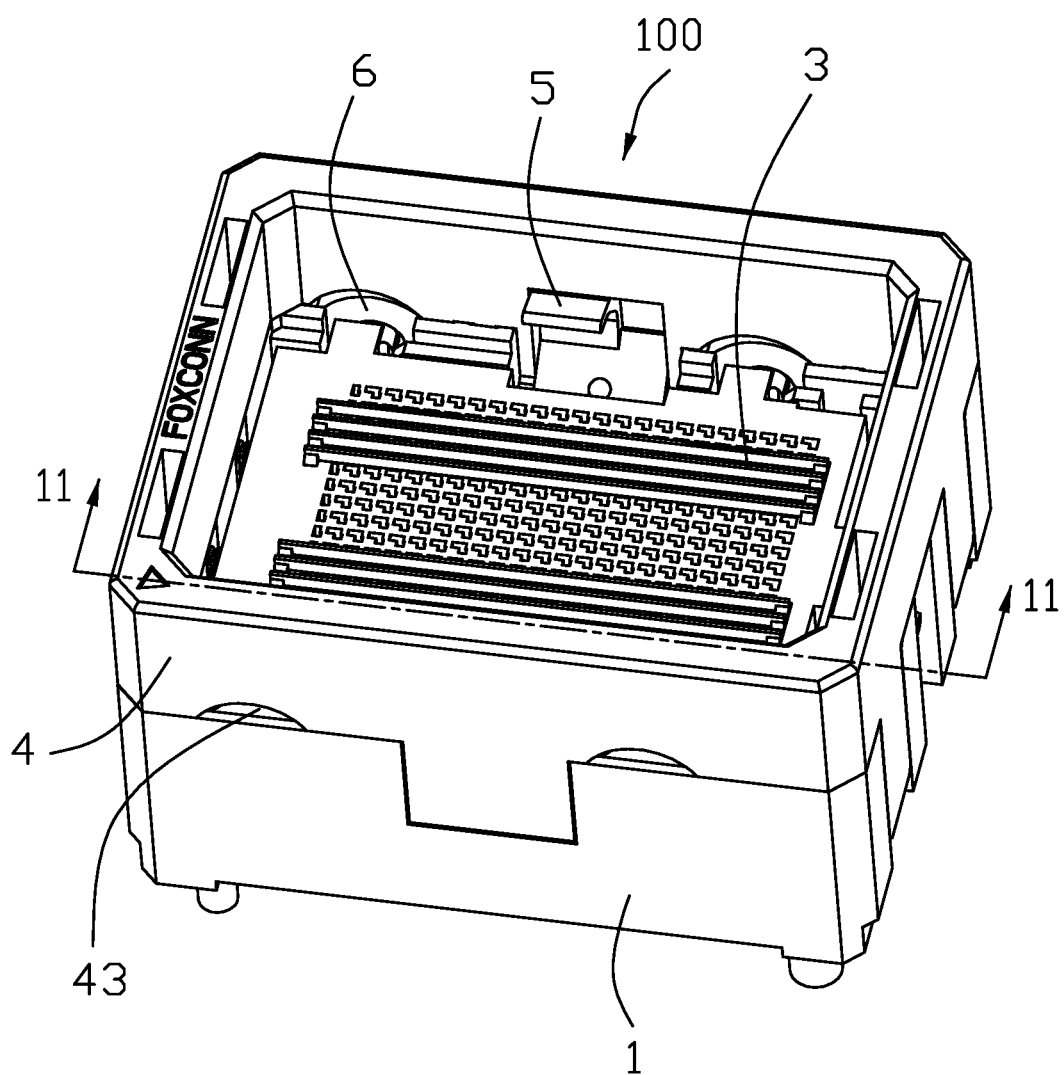
FIG. 1 is a downward perspective view of an electrical connector of a first embodiment of the invention wherein the cover is located at a lower position.
Figure 2:
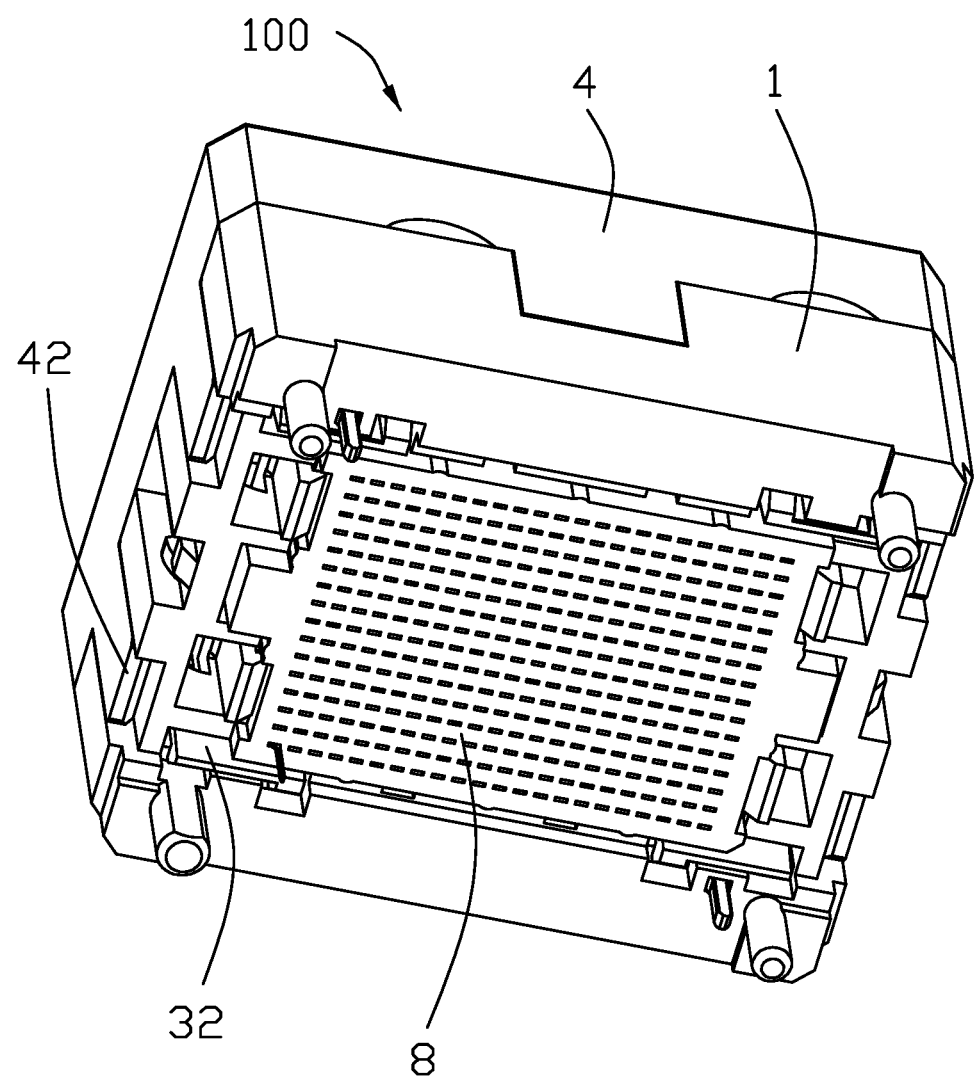
FIG. 2 is an upward perspective view of the electrical connector of FIG. 1.
Figure 3:
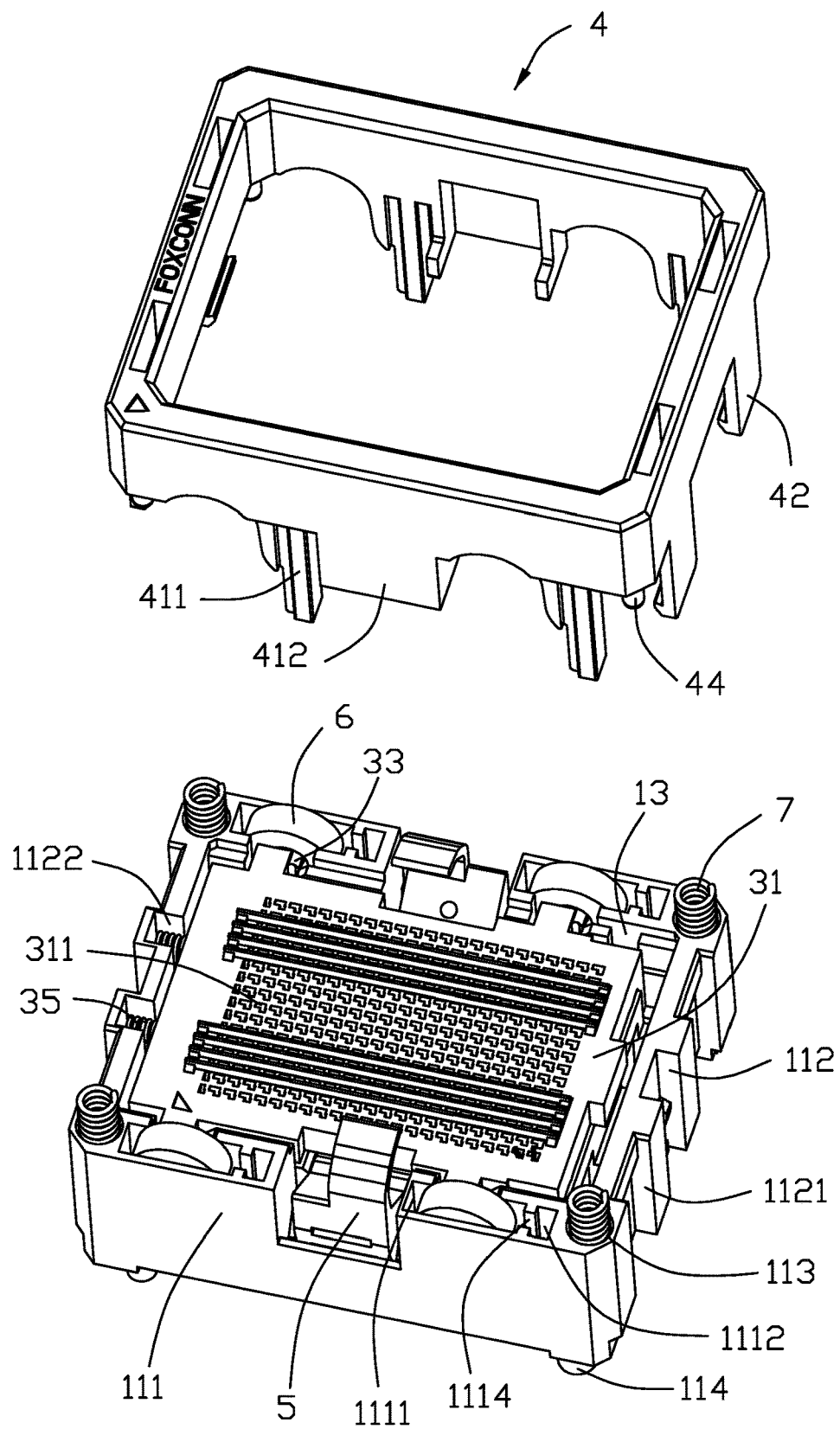
FIG. 3 is an exploded perspective view of the electrical connector of FIG. 1.
Figure 4:
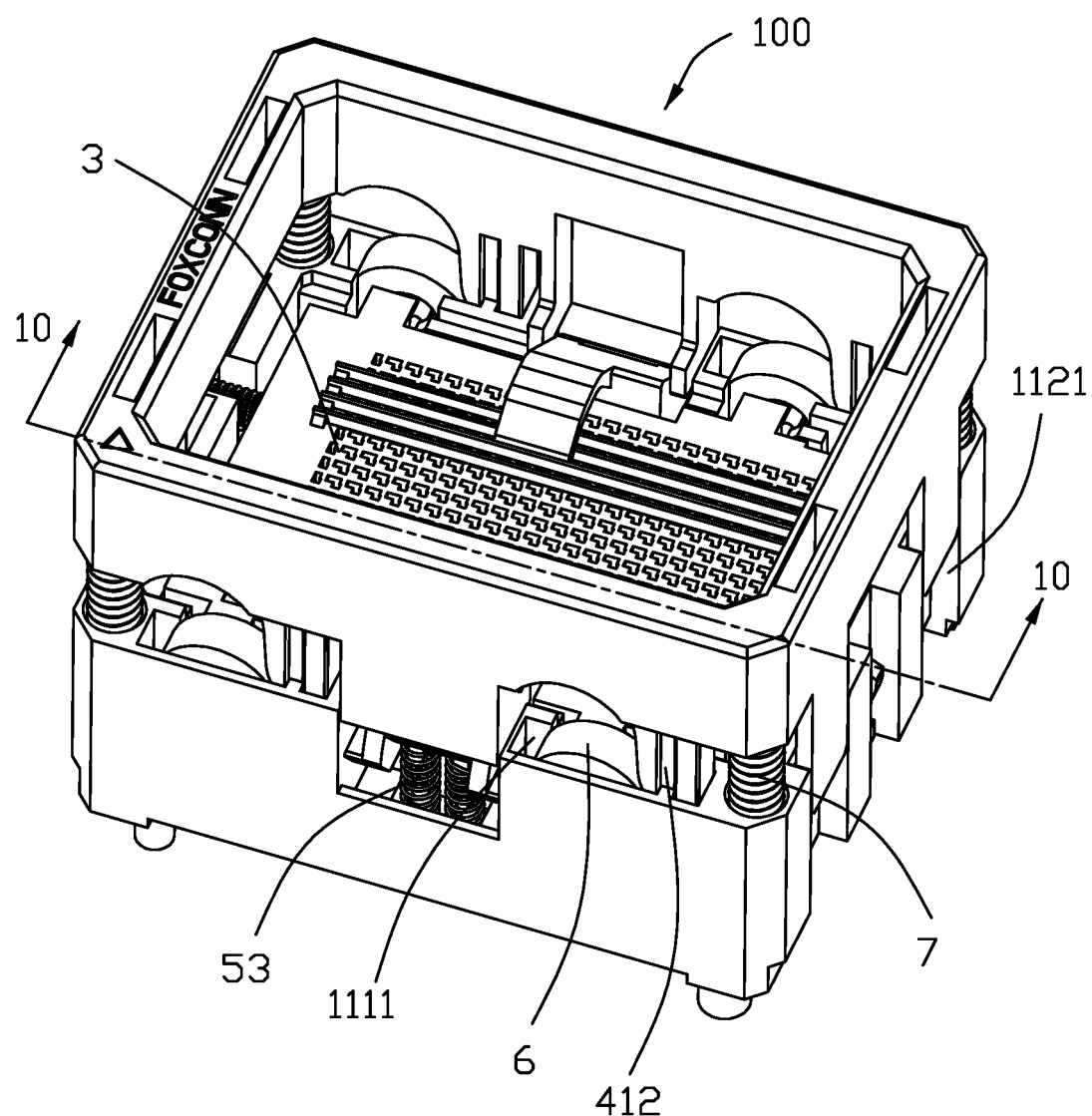
FIG. 4 is a downward perspective view of the electrical connector of FIG. 1 wherein the cover is located at an upper position.
Figure 5:
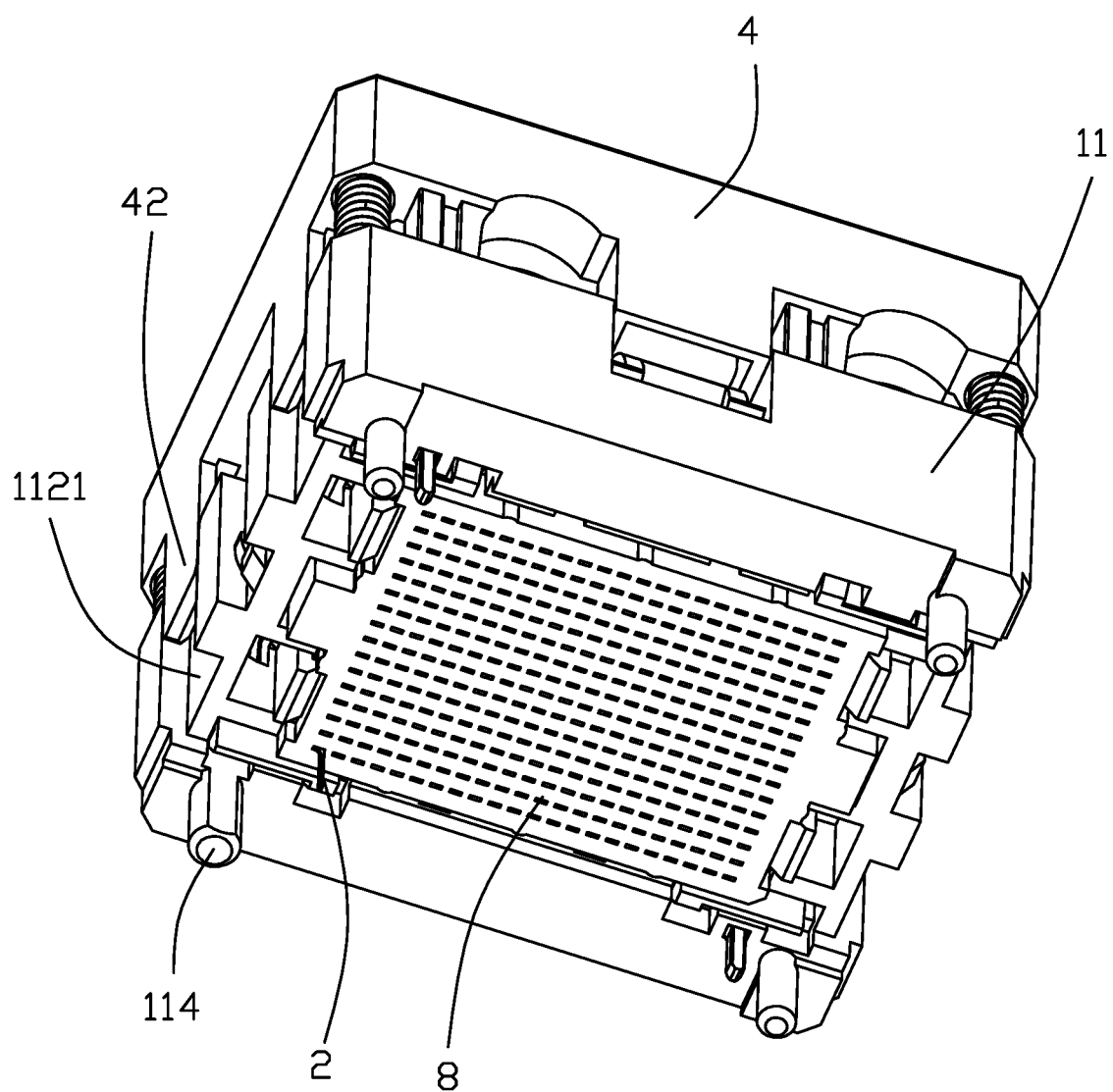
FIG. 5 is an upward perspective view of the electrical connector of FIG. 4.
Figure 6:
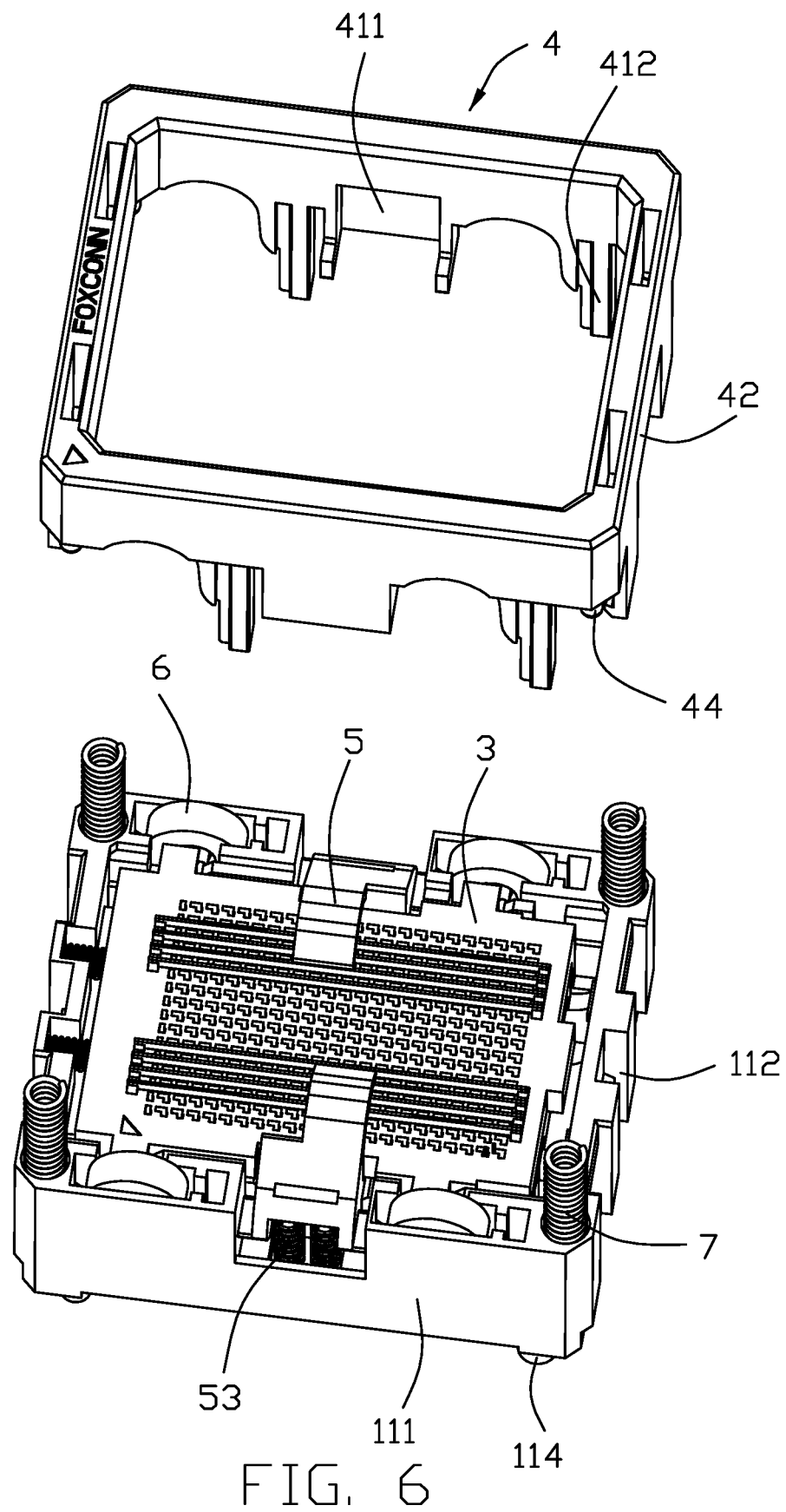
FIG. 6 is a downward exploded perspective of the electrical connector of FIG. 4.
Figure 7:
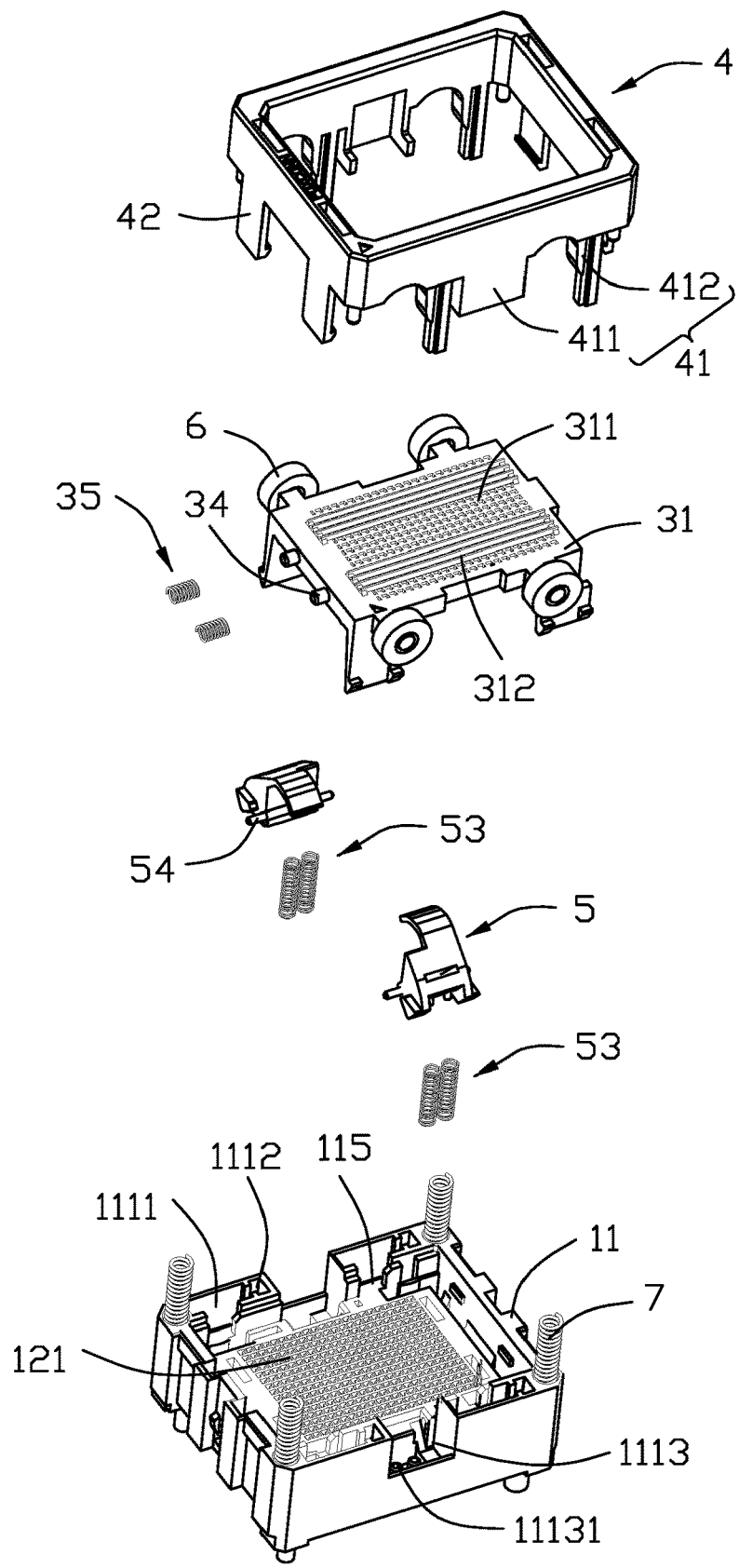
FIG. 7 is a further downward exploded perspective view of the electrical connector of FIG. 4.
Figure 8:
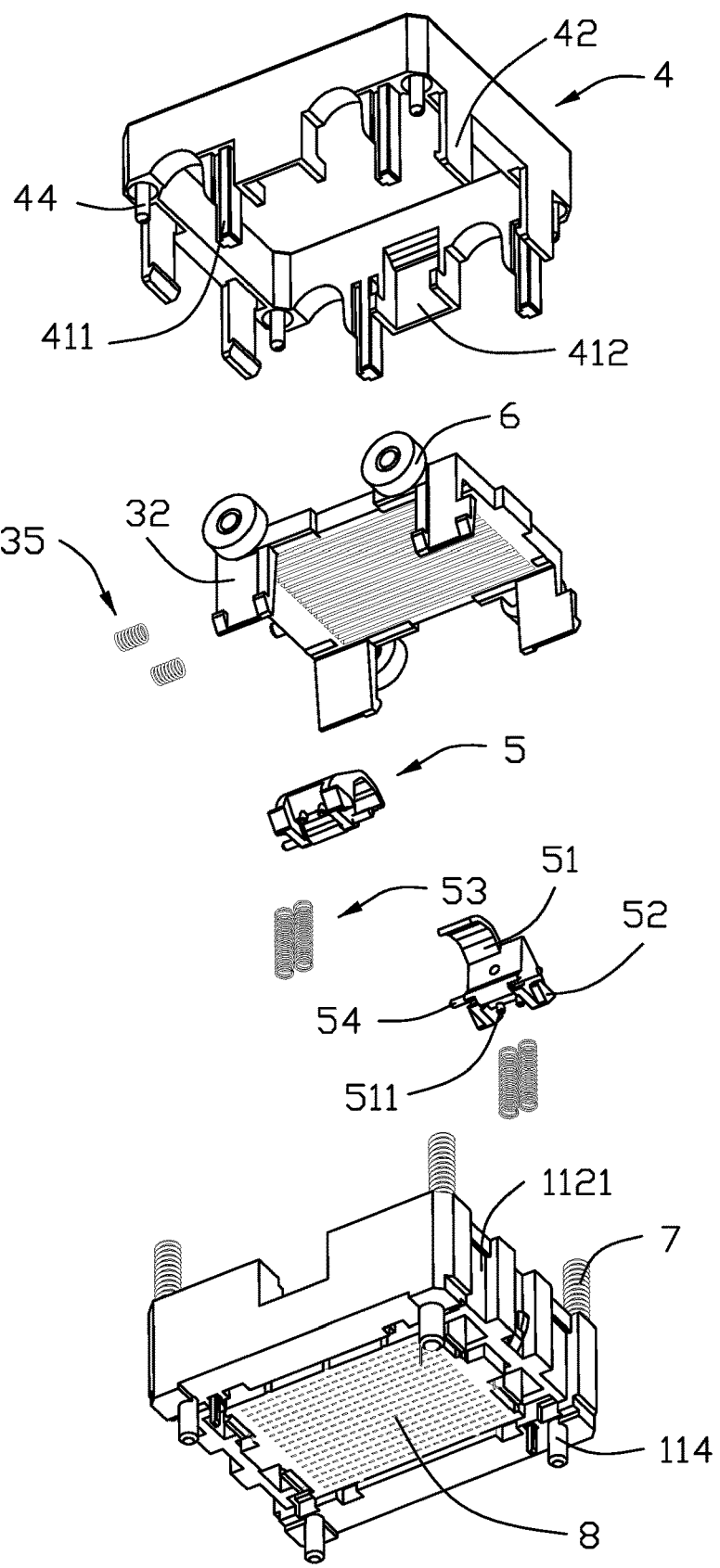
FIG. 8 is a further upward exploded view of the electrical connector of FIG. 7.
Figure 9:
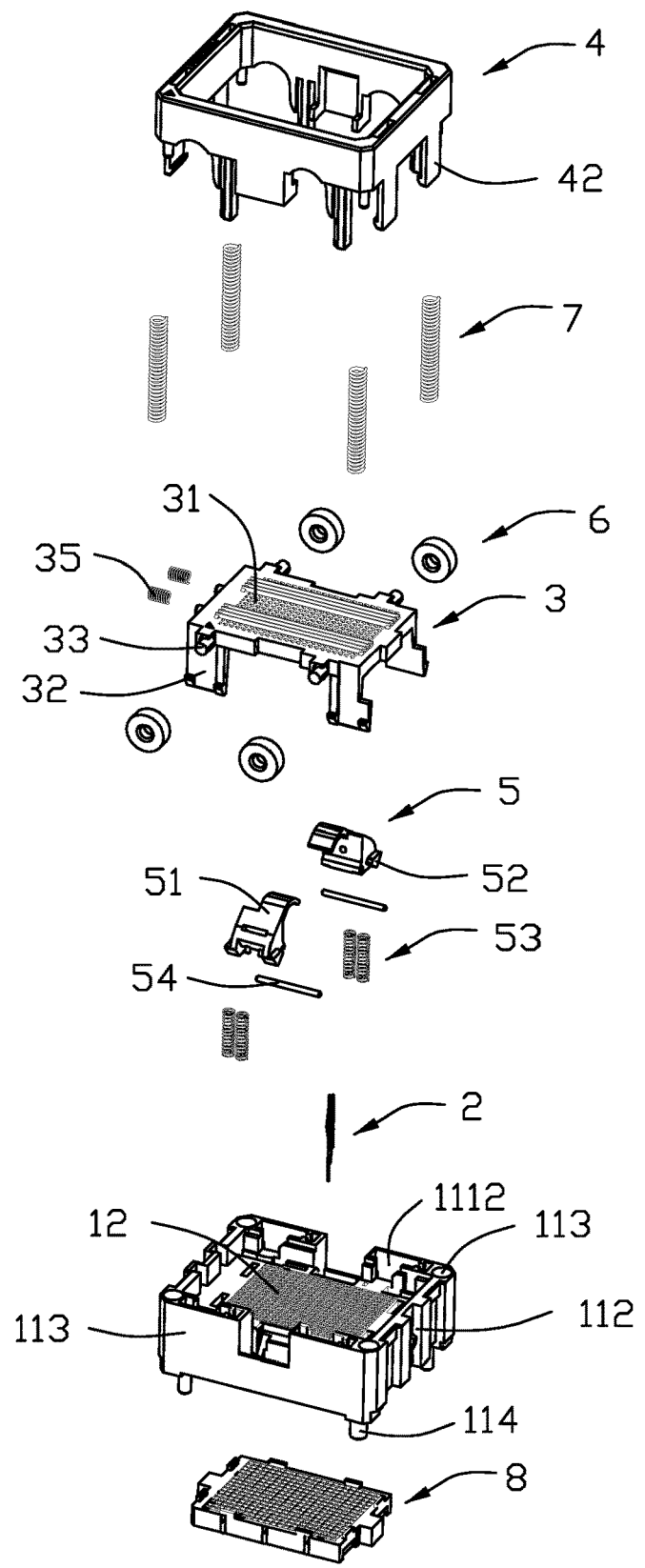
FIG. 9 is a further downward exploded perspective view of the electrical connector of FIG. 7.
Figure 10:
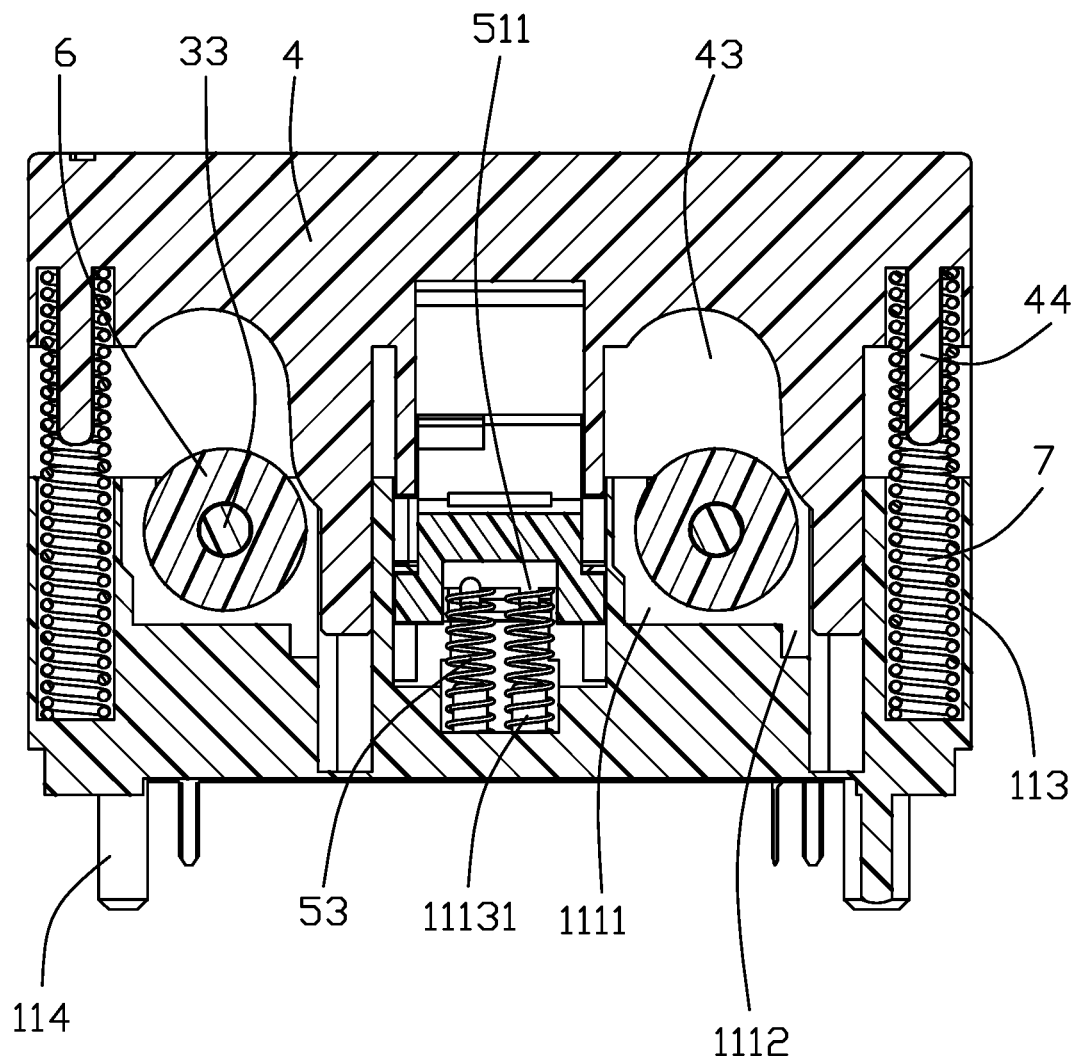
FIG. 10 is a cross-sectional view of the electrical connector of FIG. 4 along line 10-10.
Figure 11:
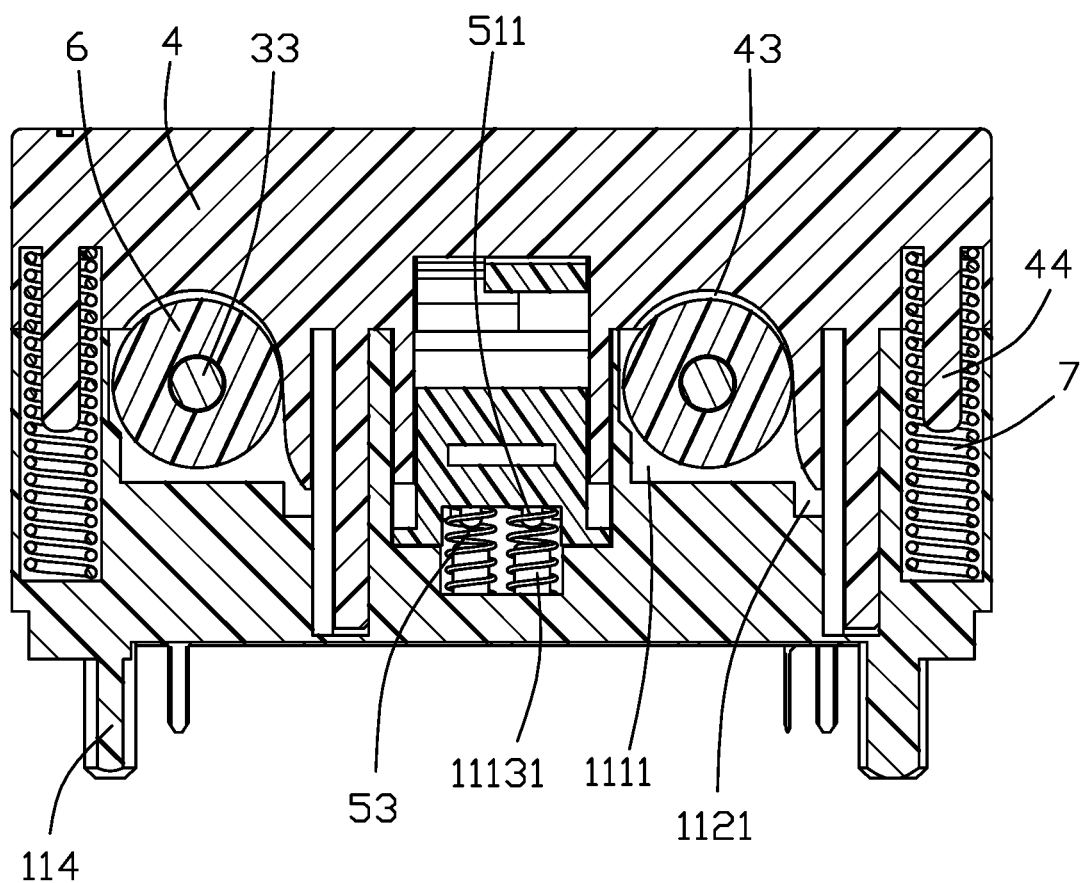
FIG. 11 is a cross-sectional view of the electrical connector of FIG. 1 along line 11-11.

Reference will now be made in detail to the embodiments of the present disclosure. The reference numerals are referred to only the respective embodiments. The first embodiment will be shown in FIGS. 1 to 11. An electrical connector 100 for receiving an electronic package (not shown), includes an insulative housing 1, a plurality of contacts 2 retained in the housing 1, a sliding plate 3 positioned upon the housing 1 and back and forth moveable relative to the housing 1 horizontally along a transverse direction, and a cover 4 assembled to the housing 1 and up and down moveable relative to the housing 1 in a vertical direction for actuating the sliding plate 3 to move, and a pair of locking devices 5.

The housing 1 includes a base 11 forming a contact seat 12 secured in the receiving cavity 13 of the base 11. The base 11 includes a pair of opposite side walls 111, and a pair of end walls 112 connected to the pair of side walls 111 to commonly form the receiving cavity 13. The base 11 forms a plurality of receiving grooves 1111 and a plurality of corresponding sliding grooves 1112 communicating with the receiving grooves 1111, respectively, for allowing the up and down movement of the cover 4. A rib 1114 is formed between the corresponding receiving groove 1111 and sliding groove 1112 with a passage to communicate the receiving groove 1111 with the sliding groove 1112. The receiving groove 1111 and the sliding groove 1112 are located in an inner side of the side wall 111, and the receiving cavity 13 communicates with the receiving groove 1111. The base 11 forms four holes 113 and four positioning posts 114 thereunder around the four corners thereof, i.e., the joined regions between the side wall 111 and the end wall 112.

The sliding plate 3 is rectangular and includes a main plate 31 and four holding arms 32 extending downwardly from four corners of the main plate 31. Two pairs of rotating shafts 33 are formed on the pair of long sides of the main plate 31, and a pair of protrusions 34 are located on one short side of the main plate 31. A plurality of ribs are formed on the main plate 31, which may support the electronic package thereon. A pair of coil springs 35 surrounds the corresponding protrusions 34. The end wall 112 forms a pair of receiving holes 1122 to receive the protrusions 34 and the associated coil springs 35. Two pair of rollers 6 are assembled upon the corresponding rotating shafts 33, and moveably received within the corresponding receiving grooves 1111. A step 115 is formed between the receiving groove 1111 and the receiving cavity 13 to support the rotating shaft 33. The sliding plate 3 includes a plurality of through holes 311 aligned with the passageways 121 of the contact seat 12 in the vertical direction so that each contact 2 extends through the corresponding passageway 121 and into the corresponding through hole 311 in the vertical direction. Notably, the downward movement of the cover 4 in the vertical direction due to the downward force may urge the sliding plate 3 to move horizontally in the transverse direction, and the sliding plate 3 may be restored back to the original position by the coil springs 35 once the downward force is removed from the cover 4 which is restored back to the original upper position by another set of springs 7 (discussed later).

The cover 4 is of a rectangular frame structure, and includes plural pairs of actuating arms 41 on the long sides, and two pairs of retention arms 42 on the short sides. The end wall 112 forms a pair of moving grooves 1121 to receive the corresponding retention arms 42 therein. On each long side, the actuating arms 41 includes a first actuating arm 411 and a pair of second actuating arms 412 by two sides of the first actuating arm 411. On each long side, a pair of notches 43 are formed to comply with the contour of the corresponding rollers 6. Downward movement of the cover 4 actuates the second actuating arms 412 to drive the corresponding rollers 6 to self rotate and move in the transverse direction, thus simultaneously drive the sliding plate 3 to move in the transverse direction. The second actuating arm 412 is downwardly moved along the sliding groove 1112 to the bottom end thereof. When the downward force of the cover 4 is removed, the actuating arms 41 associated with the cover 4 are back to their original upper position.

The connector 100 further includes a plurality of coil springs 7 and the fixing plate 8. The contacts 2 extend through the through holes 311, the passageways 121 and is retained to the fixing plate 8. The cover 4 includes four posts 44 associated with the surrounding coil springs 7 to be commonly received within the corresponding holes 113, respectively. The pivotal locking device 5 includes a pressing section 51 and a pair of pressed sections 52 opposite to each other with therebetween a pair of pivots 54 received within the corresponding side wall 111, and two protrusions 511 with the associated two springs 53. The base 11 forms the receiving spaces 1113 to receive the corresponding locking devices 5 wherein the pivots 54 extend through the side surfaces beside of the receiving space 1113. Each receiving space 1113 includes two posts 11131 to receive lower ends of the corresponding springs 53. Understandably, the first actuating arm 411 may downwardly press the pressed section 52 to lift the corresponding pressing section 51 in an open status for loading the electronic package upon the sliding plate 3. Once the downward force is removed, the cover 4 is pushed back to the original upper position by the springs 7, and the locking device 5 is pushed back to the original closed status by the springs 53.

The operation method of the invention is described as follows. The cover 4 is downwardly pressed to have the first actuating arm 411 drive the locking device 5 to be in an open status, and simultaneously have the second actuating arm 412 push the roller 6 with the associated sliding plate 3 sidewardly in the transverse direction so as to have the corresponding contacts 2 in an open state for zero insertion force of the corresponding electrodes of the electronic package. In this procedure, the second actuating arm 412 is moved within and along the corresponding sliding groove 1112 while the retention arm 42 is moved within and along the corresponding moving groove 1121. Once the electronic package is loaded into the receiving cavity 13, the downward force originally applied upon the cover 4 is removed therefrom, the cover 4 is upwardly moved back to the original upper position by the spring 7, the sliding plate 3 is horizontally moved to the original position by the spring 35, and the locking device 5 is pivotally moved to the original position by the spring 53 to lock the electronic package. Understandably, the retention arm 42 has the hook at the bottom end so as not to be disengaged from the moving groove 1121 when the cover 4 is moved to the upper position. The hook at the bottom of the holding arm 32 may assure no withdrawal of the sliding plate 3 from the housing 1 in the vertical direction. The confrontation between the roller 6 and the second actuating arm 412 can efficiently eliminate the friction therebetween so as to achieve the less actuation force, e.g., 3.77 kgf.

Figure 12:
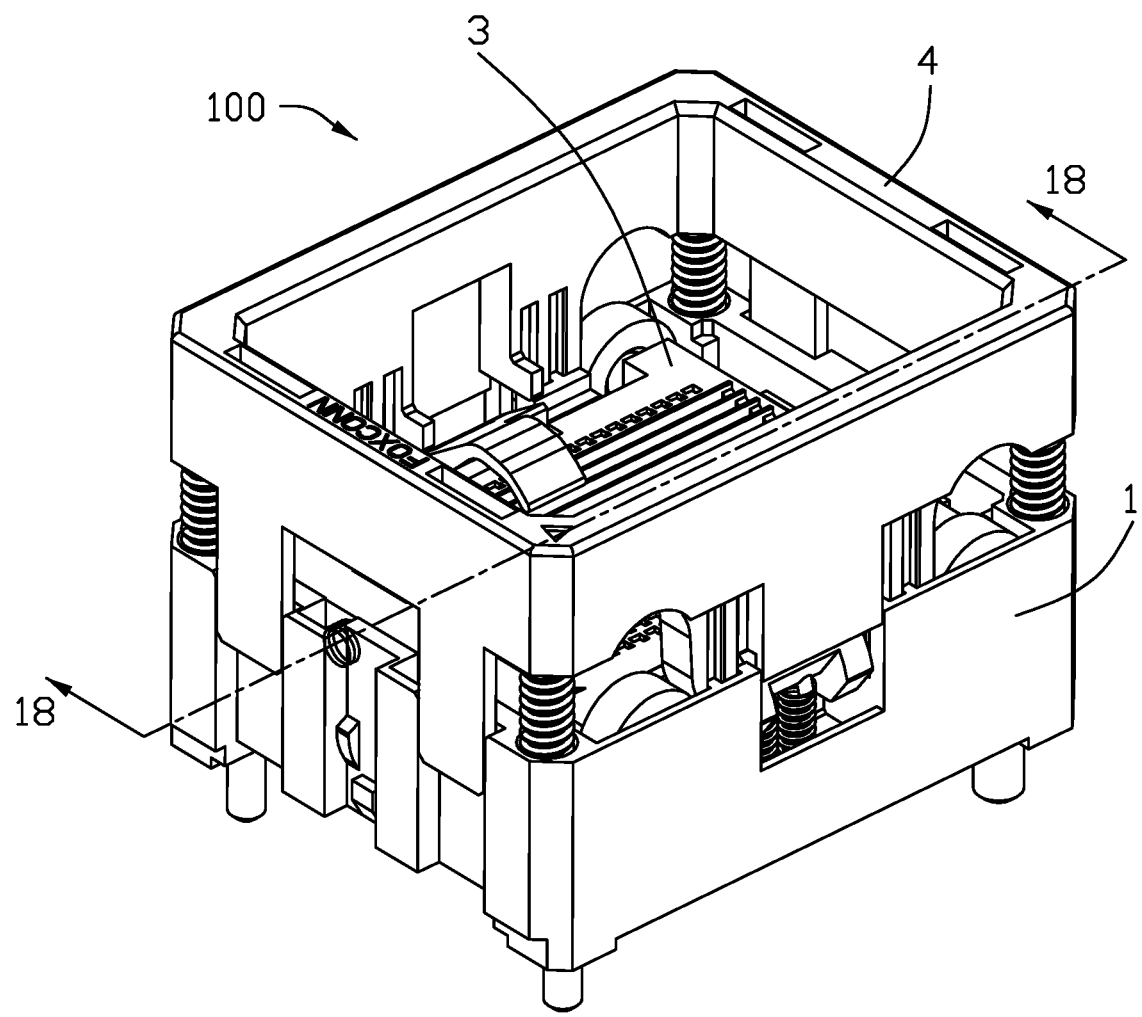
FIG. 12 is a downward perspective view of an electrical connector of a second embodiment of the invention wherein the cover is located in an upper position.
Figure 13:
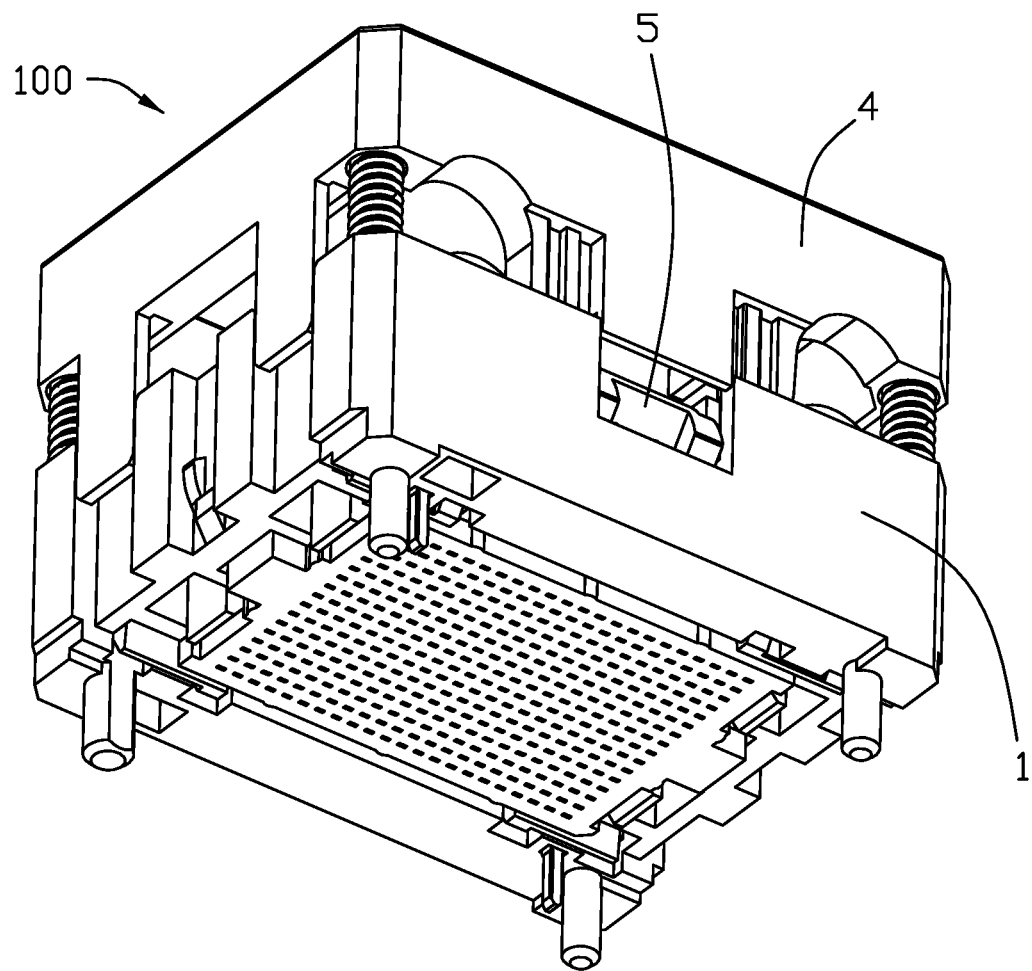
FIG. 13 is an upward perspective view of the electrical connector of FIG. 12.
Figure 14:
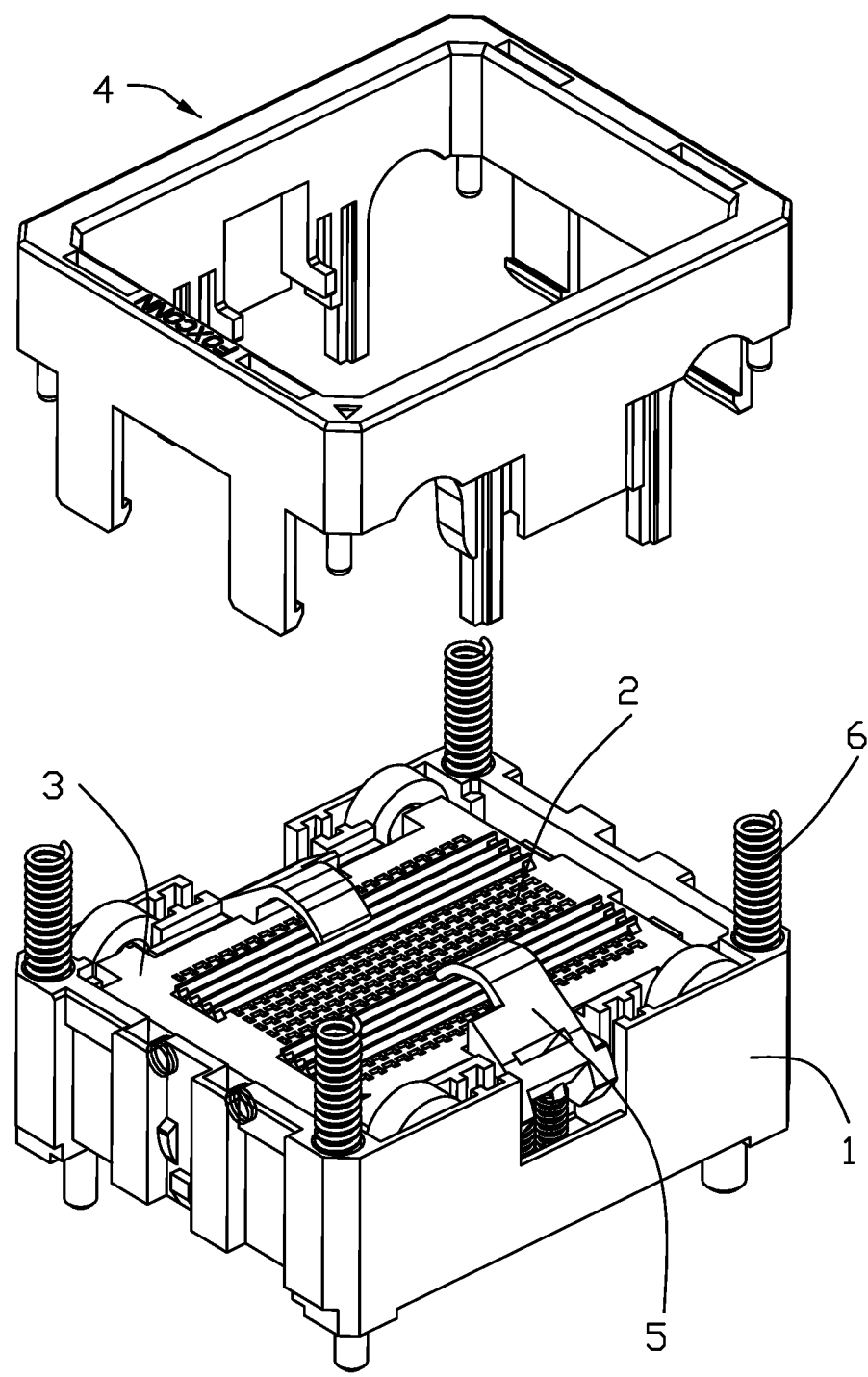
FIG. 14 a downward exploded perspective view of the electrical connector of FIG. 12.
Figure 15:
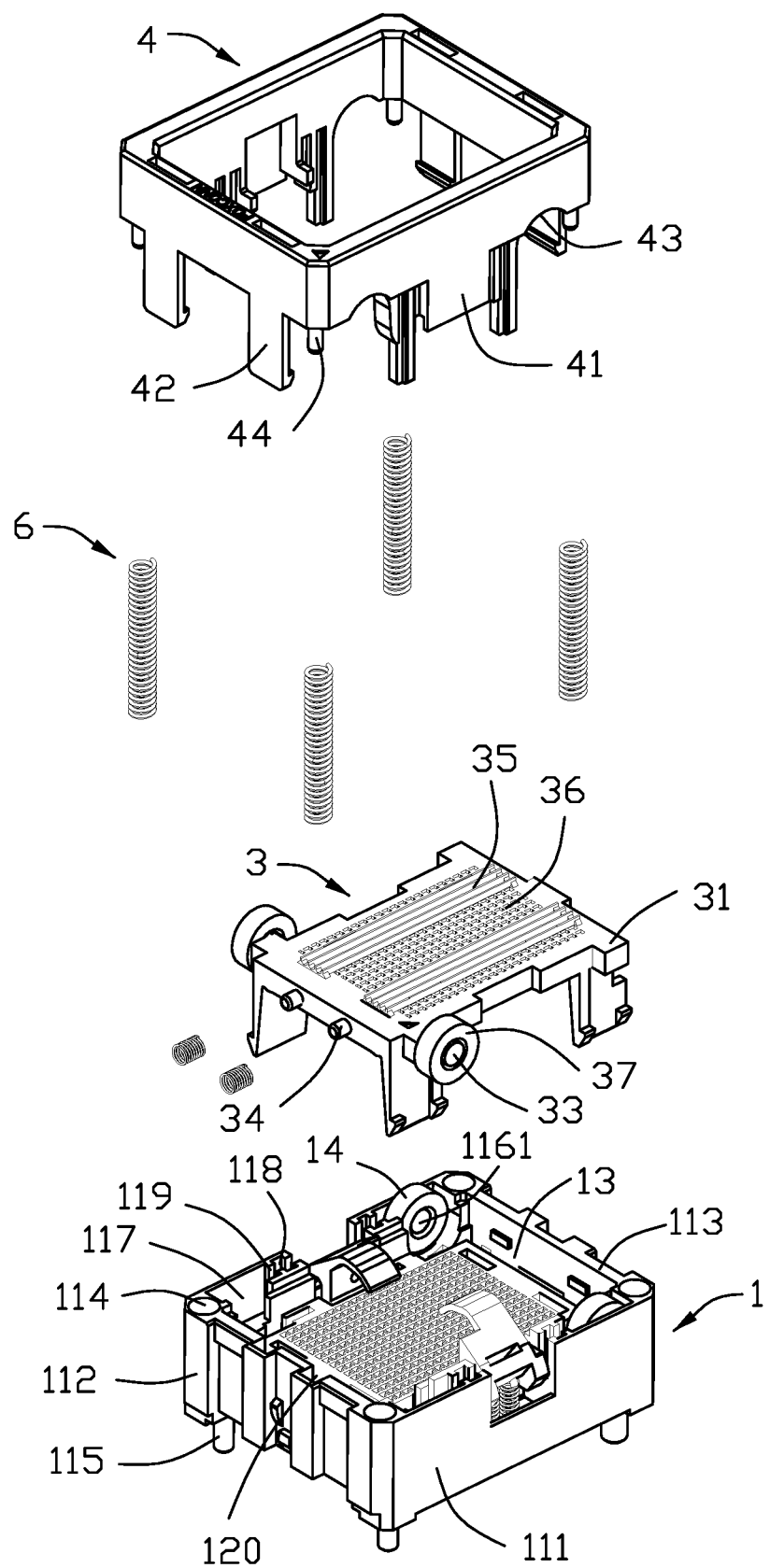
FIG. 15 is a further downward exploded perspective view of the electrical connector of FIG. 14.
Figure 16:
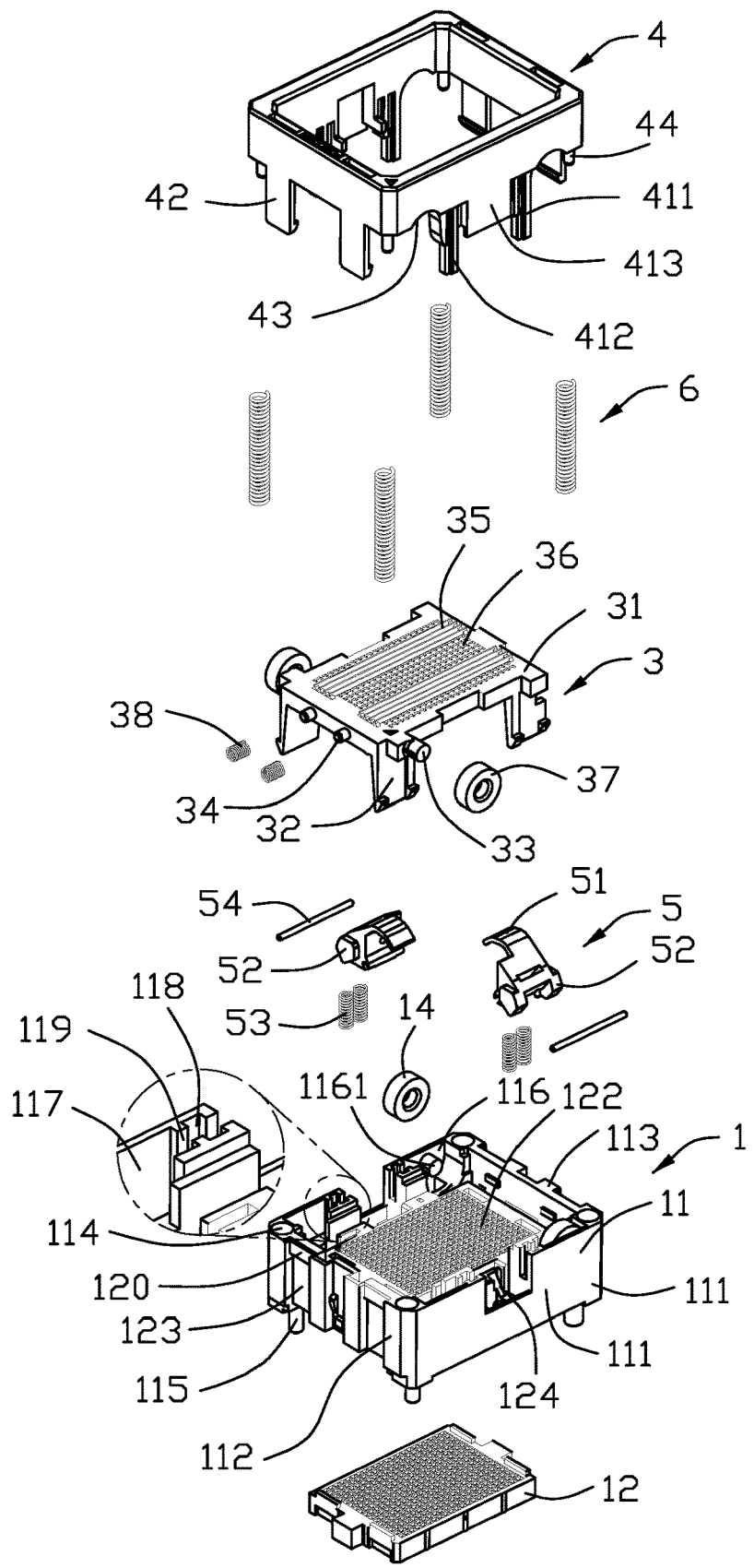
FIG. 16 is a further downward exploded perspective view of the electrical connector of FIG. 15.
Figure 17:
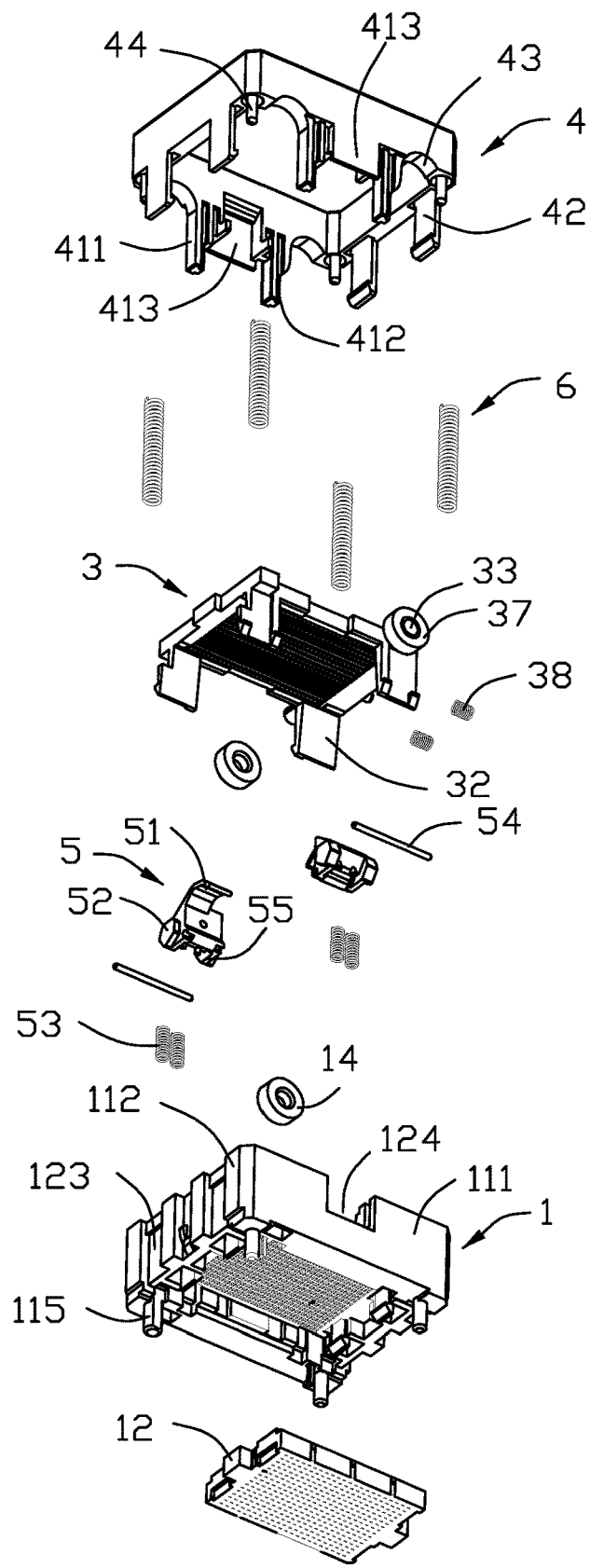
FIG. 17 is an upward exploded perspective of the electrical connector of FIG. 16.
Figure 18:
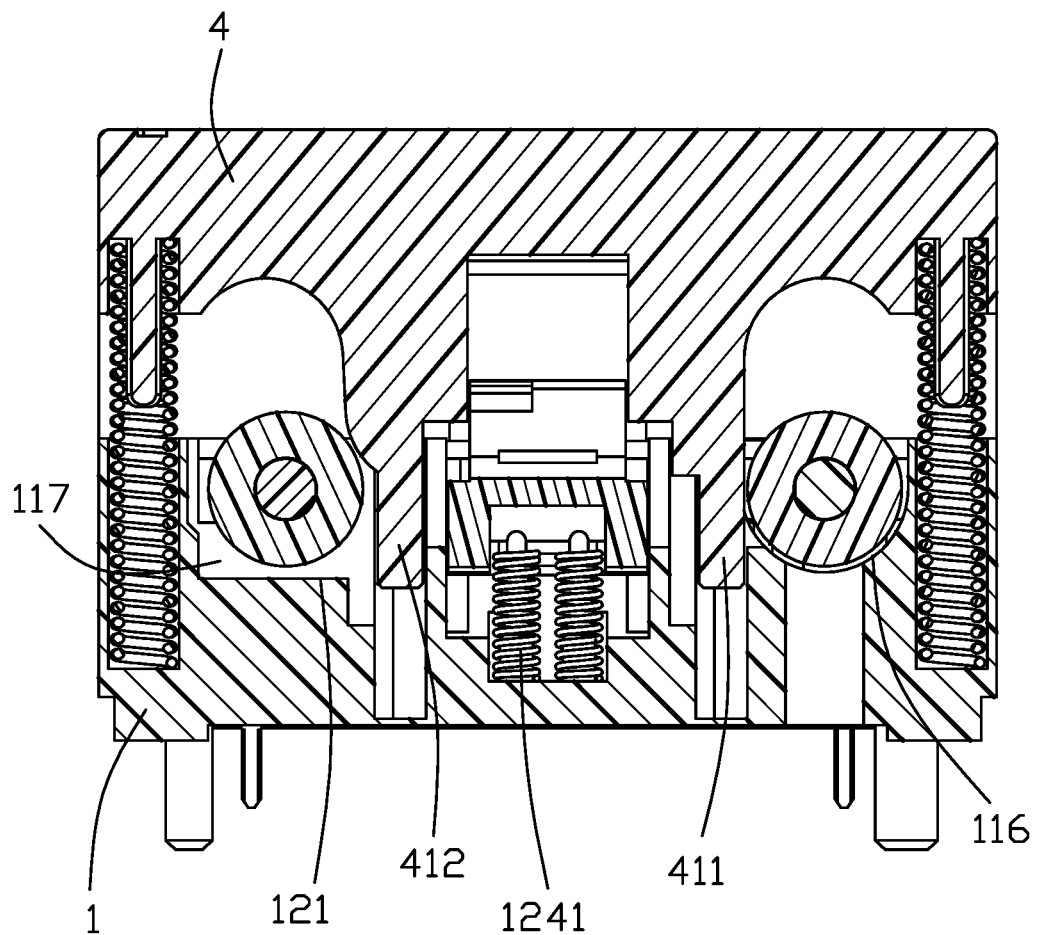
FIG. 18 is a cross-sectional view of the electrical connector of FIG. 12

Referring to FIGS. 12-18, the connector 100 which is essentially similar to that in the first embodiment except a pair of rollers is installed upon the housing instead of the sliding plate, includes an insulative housing 1, a plurality of contacts 2 retained in the housing 1, the sliding plate 3 moveable relative to the housing 1 in the horizontal direction, the cover 4 assembled upon the housing 1 and moveable relative to the housing 1 in the vertical direction, and a pair of locking devices 5.

The housing 1 includes a contact seat 11, a pair of side walls 111 and a pair of end walls 112 to commonly form the receiving cavity 13. Four holes 114 and four positioning posts 115 are formed around the four corners. A pair of first receiving grooves 116 and a pair of sliding grooves 118 communicate with each other with corresponding ribs 119 therebetween. A roller shaft 1161 is formed in the first receiving groove 116, on which the first roller 14 is mounted. A pair of second receiving grooves 117 another pair of sliding grooves 118 are located beside the pair of first receiving grooves 116. The sliding plate 3 includes the shafts 33 on which the second rollers 37 are mounted so as to be received within the corresponding second receiving grooves 117. A step 121 is formed around the second receiving groove 117 on which the shaft 33 is abuts.

The sliding plate 3 includes a main plate 31 and four downwardly extending holding arms 32 around four corners. A pair of shafts 33 are formed on the long side and a pair of protrusions 34 are formed on one short side. The main plate 31 forms a plurality of ribs 35. A pair of springs 38 are assembled upon the protrusions 34. The end wall 112 forms the receiving holes 120 to receive the springs 38 and the protrusions 34. The sliding plate 3 forms a plurality of through holes aligned with the corresponding passageways 122 in the contact seat 12.

The cover 4 is of a frame structure including two pairs of actuating arms 41 and two pairs of retention arms 42 which are moveable along the moving grooves 123 in the end walls 112. The actuating arms 41 include a pair of first actuating arms 411 and a pair of second actuating arms 412. The first actuating arm 411 confronts the first roller 14 in the first receiving groove 116. The second actuating arm 412 forms a curved structure to confront the second roller 37 so as to push the second roller 37 to sideward move. In this embodiment, the first actuating arm 411 and the second actuating arm 412 are commonly located between the first roller 14 and the second roller 37 in the transverse direction. The cover 4 further includes a plurality of notches 43 compliantly receiving the first rollers 14 and the second rollers 37 when the cover 4 is moved to the lower position with the first actuating arms 411 and the second actuating arms 412 reach the bottom ends of the corresponding sliding grooves 118.

The connector 100 further includes four springs 6 surrounding the posts 44 of the cover 4 to be commonly received with the holes 114. The locking device 5 includes the pressing section 51, the pressed section 52, the spring 53, the pivots 54, and two protrusions 55. The base 11 forms a receiving space 124 with a pair of posts 1241 so as to receive the corresponding locking device 5 with the spring 53 surrounding the corresponding post 1241 and the protrusion 55. The cover 4 includes a third actuating arm 413 to downwardly press the pressed section 52. The pivots 54 are installed to the side surfaces beside the receiving space 124.

During operation, the cover 4 is downwardly pressed to have the third actuating arm 413 drive the locking device 5 to be in an open status, the first actuating arm 411 actuate the first roller 14 to rotate, and the second actuating arm 412 actuate the second roller 37 to self-rotate and sideward move. The contacts 2 are also actuated by the sliding plate 3 to be in an open state for zero insertion force with regard to the electronic package. In this stage, all the springs 38, the springs 6 and the springs 53 are compressed. After the electronic package is loaded upon the sliding plate 3, the downward force originally applied upon the cover 4 is removed, so that the locking device 5 is moved to the locked position by the springs 53, the sliding plate 3 is moved back to the original horizontal position by the springs 38, and the cover 4 is moved back to the original upper position by the springs 6.

Compared with the first embodiment, in the second embodiment the first roller 14 mounted upon the housing 1 is only rotated without sideward moving, thus providing more stability of the cover 4 relative to the housing 1. Anyhow, compared with the prior arts, in the instant invention both the first embodiment and the second embodiment use the dynamic friction between the up-and-down moveable cover and the back-and-forth moveable sliding plate via the roller structure instead of the static friction via the traditional wedge structure, so as to significantly lower the friction force and associated operation force advantageously. Notably, the roller may be applied to the actuating arm of the cover instead of the housing or the sliding plate to urge the sliding plate alternately, the limited structure allows While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:
1. An electrical connector comprising:
an insulative housing defining a receiving cavity for receiving an electronic package therein;
a plurality of contacts retained in the housing;
an insulative sliding plate mounted upon the housing and back and forth moveable relative to the housing in a transverse direction; and
a cover mounted upon the housing and up and down moveable relative to the housing in a vertical direction perpendicular to the transverse direction, said cover further including an actuating arm to sideward pushing the sliding plate in the transverse direction; wherein
at least a roller is installed upon the sliding plate, and directly contacts the actuating arm so as not only rotate but also sidewardly move in the transverse direction in response to downward movement of the actuating arm in the vertical direction; wherein
the cover forms at least one notch in a downward edge to compliantly receive an upper portion of said at least one roller when the cover is downwardly moved to a lower position in the vertical direction.

2. The electrical connector as claimed in claim 1, wherein the cover is rectangular with a pair of long sides and a pair of short sides, and the roller is located around the long side.

3. The electrical connector as claimed in claim 2, wherein the housing forms a receiving groove to receive the roller, and a sliding groove communicatively located beside the receiving groove to receive the actuating arm.

4. The electrical connector as claimed in claim 3, wherein a width of said receiving groove along the transverse direction is larger than a diameter of the roller to allow sideward movement of the roller in the transverse direction.

5. The electrical connector as claimed in claim 3, further including a pivotal locking device assembled upon the housing for locking the electronic package, wherein the cover further includes another actuating arm to actuate the locking device, and said another actuating arm is located at a middle of the long side while said actuating arm is located beside said another actuating arm.

6. The electrical connector as claimed in claim 4, wherein said roller and another roller are located by two sides of said another actuating arm.

7. The electrical connector as claimed in claim 5, wherein said another roller is installed on the sliding plate.

8. The electrical connector as claimed in claim 5, wherein said another roller is installed on the housing.

9. An electrical connector comprising:
an insulative housing defining a receiving cavity for receiving an electronic package therein;
a plurality of contacts retained in the housing;
an insulative sliding plate mounted upon the housing and back and forth moveable relative to the housing in a transverse direction; and
a cover mounted upon the housing and up and down moveable relative to the housing in a vertical direction perpendicular to the transverse direction, said cover including an actuating arm to sidewardly pushing the sliding plate in the transverse direction; wherein
at least a roller is installed upon one of the housing and the actuating arm of the cover, so as to result in a dynamic friction between the cover and the sliding plate to drive the sliding plate to move in the transverse direction in response to downward movement of the actuating arm in the vertical direction, wherein
said at least one roller is moveable in the vertical direction when installed on the cover, and immovable in both the vertical direction and the transverse direction when installed on the housing for stabilization consideration.

10. The electrical connector as claimed in claim 9, further including another roller installed upon the sliding plate.

11. The electrical connector as claimed in claim 10, wherein said cover includes at least one notch in a downward edge to compliantly receive an upper portion of said another roller when the cover is downwardly moved to a lower position in the vertical direction.

12. The electrical connector as claimed in claim 11, wherein the housing forms a receiving groove to receive the roller, and a sliding groove communicatively located beside the receiving groove to receive the actuating arm.

13. The electrical connector as claimed 12, wherein the cover is rectangular with a pair of long sides and a pair of short sides, and the roller is located around the long side.

14. The electrical connector as claimed in claim 13, further including a pivotal locking device assembled upon the housing for locking the electronic package, wherein the cover further includes another actuating arm to actuate the locking device, and said another actuating arm is located at a middle of the long side while said actuating arm is located beside said another actuating arm.

15. An electrical connector comprising: an insulative housing defining a receiving cavity for receiving an electronic package therein;
  a plurality of contacts retained in the housing;
  an insulative sliding plate mounted upon the housing and back and forth moveable relative to the housing in a transverse direction, said sliding plate being rectangular with two long sides and two short sides; and
  a cover mounted upon the housing and up and down moveable relative to the housing in a vertical direction perpendicular to the transverse direction, said cover sidewardly pushing the sliding plate in the transverse direction; wherein
  a pair of rollers are positioned around two long sides of the sliding plate so as to result in dynamic friction between the cover and the sliding plate in response to downward movement of the actuating arm in the vertical direction; wherein
  the cover forms a pair of notches in opposite downward edges to respectively compliantly receive corresponding upper portions of the pair of rollers when the cover is downwardly moved to a lower position in the vertical direction.

16. The electrical connector as claimed in claim 15, wherein the roller are installed on the sliding plate.

17. The electrical connector as claimed in claim 16, wherein the housing is equipped with a pair of pivotal locking devices, the cover includes a pair of actuating arms to actuate the pair of locking devices, each actuating arm is located at a middle of each long side and the roller is beside the actuating arm in the transverse direction.

18. The electrical connector as claimed in claim 17, wherein said cover further includes another pair of actuating arms to directly contact the pair of rollers.

19. The electrical connector as claimed in claim 18, wherein said another pair of actuating arms are located between the pair of rollers and the pair of actuating arms in the transverse direction.

20. The electrical connector as claimed in claim 18, wherein the housing forms a pair of receiving grooves to receive the corresponding rollers, and a pair of sliding grooves respectively communicatively located beside said pair of receiving grooves to receive said another pair of actuating arms.

* * * * *